(12) United States Patent
Pei et al.

(10) Patent No.: US 9,363,112 B2
(45) Date of Patent: Jun. 7, 2016

(54) SYSTEMS AND METHODS FOR EQUALIZATION IN RADIO FREQUENCY SIGNAL PATHS

(71) Applicant: HARRIS CORPORATION, Melbourne, FL (US)

(72) Inventors: Alexander X. Pei, Fairport, NY (US); Edwin McCall Leiby, III, Parkland, FL (US)

(73) Assignee: HARRIS CORPORATION, Melbourne, FL (US)

( * ) Notice: Subject to any disclaimer, the term of this patent is extended or adjusted under 35 U.S.C. 154(b) by 78 days.

(21) Appl. No.: 13/927,840

(22) Filed: Jun. 26, 2013

(65) Prior Publication Data

US 2015/0003501 A1 Jan. 1, 2015

(51) Int. Cl.

| | |
|---|---|
| *H04K 1/02* | (2006.01) |
| *H04L 25/03* | (2006.01) |
| *H04L 25/49* | (2006.01) |
| *H04B 1/40* | (2015.01) |
| *H04B 1/04* | (2006.01) |
| *H04L 27/36* | (2006.01) |
| *H04L 27/38* | (2006.01) |

(52) U.S. Cl.
CPC ........ *H04L 25/03891* (2013.01); *H04B 1/0475* (2013.01); *H04B 1/40* (2013.01); *H04L 25/03343* (2013.01); *H04L 27/368* (2013.01); *H04L 27/38* (2013.01); *H04B 2001/0425* (2013.01)

(58) Field of Classification Search
CPC ..... H04B 1/0475; H04W 24/08; Y02B 60/50; H03F 1/3247; H03F 3/19
USPC ........................................................ 375/296
See application file for complete search history.

(56) References Cited

U.S. PATENT DOCUMENTS 5,583,501 A * 12/1996 Henrion .............. H03M 1/1042
341/118
6,909,757 B2 6/2005 Justice et al.
(Continued)

FOREIGN PATENT DOCUMENTS

EP 2086194 A2 8/2009

OTHER PUBLICATIONS

Lohtia A et al: "An Adaptive Digital Technique for Compensating for Analog Quadrature Modulator/Demodulator Impairments", Proceedings of the Pacific Rim Conference on Communications, Computers and Signal Processing. Victoria, May 19-21, 1993; New York, IEEE, US, vol. 2 of 02, May 19, 1993, pp. 447-450, XP000419312, p. 448, col. 1—p. 449, col. 2; figures 5, 6

*Primary Examiner* — Shuwang Liu
*Assistant Examiner* — Gina McKie
(74) *Attorney, Agent, or Firm* — Allen, Dyer, Doppelt, Milbrath & Gilchrist, P.A.

(57) ABSTRACT

The wireless communications device has a transmit signal path including a digital-to-analog converter and associated circuitry, a receive signal path including an analog-to-digital converter, and a magnitude detector sampling the transmit signal path and providing output to a signal controller. The signal controller is configured to determine amplitude distortion and determine phase distortion based upon information from the magnitude detector, and generate an equalization filter (e.g. during power-up of the wireless communication device), based upon the determined amplitude distortion and phase distortion, for pre-distortion of regular traffic output through the transmit signal path. The approach provides compensation for both amplitude and phase based upon the sampling of an output of a magnitude detector in Radio Frequency (RF) signal paths.

22 Claims, 3 Drawing Sheets

(56) References Cited

U.S. PATENT DOCUMENTS

| | | | |
|---|---|---|---|
| 7,787,564 B1 * | 8/2010 | Anvari | 375/297 |
| 2002/0072346 A1 | 6/2002 | Kato et al. | |
| 2002/0150171 A1 * | 10/2002 | Myers | 375/296 |
| 2003/0095607 A1 | 5/2003 | Huang | |
| 2004/0259509 A1 * | 12/2004 | Duello et al. | 455/115.1 |

* cited by examiner

SYSTEMS AND METHODS FOR EQUALIZATION IN RADIO FREQUENCY SIGNAL PATHS

FIELD OF THE INVENTION

The present invention relates to the field of wireless communications, and, more particularly, to complex equalization in Radio Frequency (RF) signal paths and related methods.

BACKGROUND OF THE INVENTION

Vector signal analyzers are useful in measuring and demodulating digitally modulated signals like W-CDMA, LTE, and WLAN. These measurements are used to determine the quality of modulation and can be used for design validation and compliance testing of electronic devices. A vector signal analyzer is an instrument that measures the magnitude and phase of the input signal centered at a single frequency within the IF bandwidth of the instrument. The primary use is to make in-channel measurements, such as error vector magnitude, code domain power, and spectral flatness, on known signals.

An important design parameter of modern wireless systems is a quantity known as the Error Vector Magnitude (EVM). When a wireless transmitter is being evaluated, EVM data is typically gathered near the final stage in an RF transmitter. EVM is a measure of the distortion detected at the transmitter. This distortion can result in errors in the interpretation of the modulated symbols. These errors alter the transmitted bit stream when the receiver tries to reconstruct the original signal. EVM can therefore be used as a metric for identifying when distortion at the transmitter can cause bit error degradation at the output of the demodulator.

A received symbol may not correspond precisely to the ideal symbol shown in the constellation diagram due to noise associated with the communication channel and imperfections of both the transmitter and receiver. The difference between a received symbol and an ideal symbol can be represented as an error vector. Generally, the smaller the magnitude of the error vector, the better the performance of the communication system. Error vector magnitude is the root mean square (RMS) magnitude of the error vector over time at the precise time instance of the symbol clock transitions. EVM is typically normalized to either the amplitude of the outermost symbol, or the square root of the average symbol power. Each symbol may be represented as a particular amplitude and phase. Thus, the transmitted signal may vary in amplitude and/or phase to transmit a string of consecutive symbols. The amplitude and phase components of a signal may be processed separately in a transmitter.

Compensation via equalization of linear distortions found in transmit and receive RF signal paths can be necessary to meet distortion specifications and provide performance margin for high density signal constellations. Full compensation requires adjustments to both the amplitude and phase of a signal. Determination of the necessary adjustment of amplitude and phase normally requires separate transmit and receive systems or a Full Duplex system capable of transmitting a waveform with amplitude and phase variations as well as sampling both the amplitude and phase.

Current state of the art requires the distorted transmit signal to be sampled via an external Vector Signal Analyzer or via special embedded circuitry that allows for Full Duplex Sampling of I/Q (Inphase and Quadrature) components of the transmitted signal. The hardware to do this is relatively expensive (e.g. Vector Signal Analyzer) or burdensome to design goals of size/weight/power (e.g. full duplex sampling of I/Q).

SUMMARY OF THE INVENTION

In view of the foregoing background, it is therefore an object of the present invention to provide compensation for both amplitude and phase based upon the sampling of an output of a magnitude detector in Radio Frequency (RF) signal paths.

This and other objects, features, and advantages in accordance with the present invention are provided by a wireless communications device having a transmit signal path including a digital-to-analog converter and associated circuitry, a receive signal path including an analog-to-digital converter, and a magnitude detector coupled into the transmit signal path and whose output is available to a signal controller. The signal controller is configured to determine amplitude distortion and determine phase distortion based upon information from the magnitude detector, and generate an equalization filter (e.g. during power-up of the wireless communication device), based upon the determined amplitude distortion and phase distortion, e.g. for pre-distortion of regular traffic output through the transmit signal path.

A method aspect is directed to compensating for linear distortions in at least a transmit signal path of a wireless communications device. The method includes determining amplitude distortion and also determining phase distortion based upon information from a magnitude detector sampling the transmit signal path. The method further includes generating an equalization filter, based upon the determined amplitude distortion and phase distortion, e.g. for pre-distorting regular traffic output through the transmit signal path with the equalization filter.

Thus, in the present approach, a transmit signal can be sampled without a relatively expensive Vector Signal Analyzer or burdensome circuitry that allows for Full Duplex Sampling of I/Q components of the transmitted signal.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention may be embodied as methods, communication devices, communication systems, and/or computer program products, and may be embodied in hardware and/or in software.

An example radiotelephone communication system, in accordance with embodiments of the present invention, includes one or more mobile devices and also includes a base station transceiver. The mobile device may include a keyboard/keypad, display, speaker, microphone, transceiver and a memory that communicate with a processor. The transceiver typically includes a transmit path and a receive path, which respectively transmits outgoing radio frequency signals to the base station transceiver, or other mobile devices, and receives incoming radio frequency signals from the base station transceiver, via an antenna. The radio frequency signals transmitted between the mobile device and the base station transceiver may comprise both traffic and control signals, which are used to establish and maintain communication with another party or destination.

Figure 1:
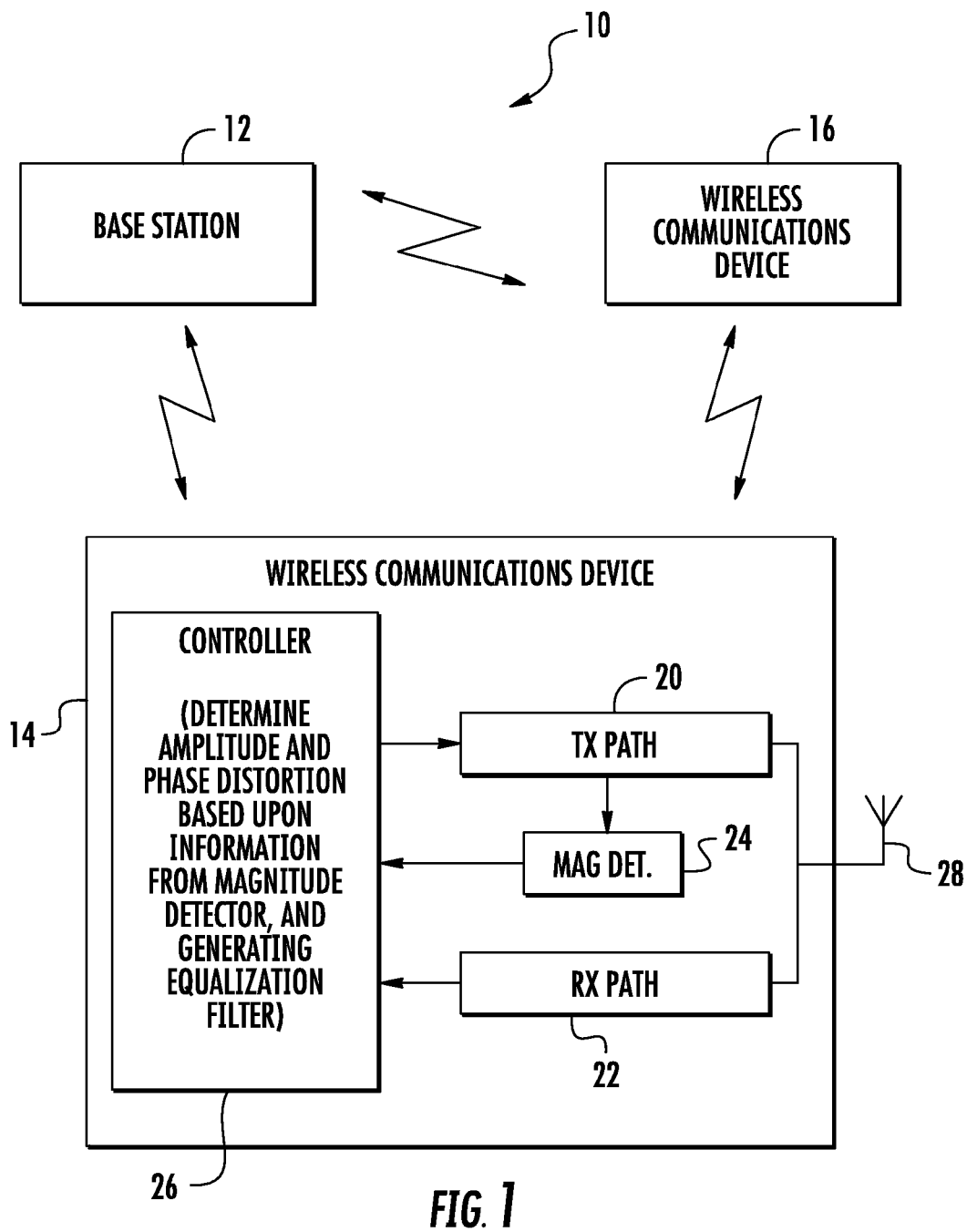
FIG. 1 is schematic block diagram of a communications system including an embodiment of a wireless communications device in accordance with features of the present invention.
Figure 2:
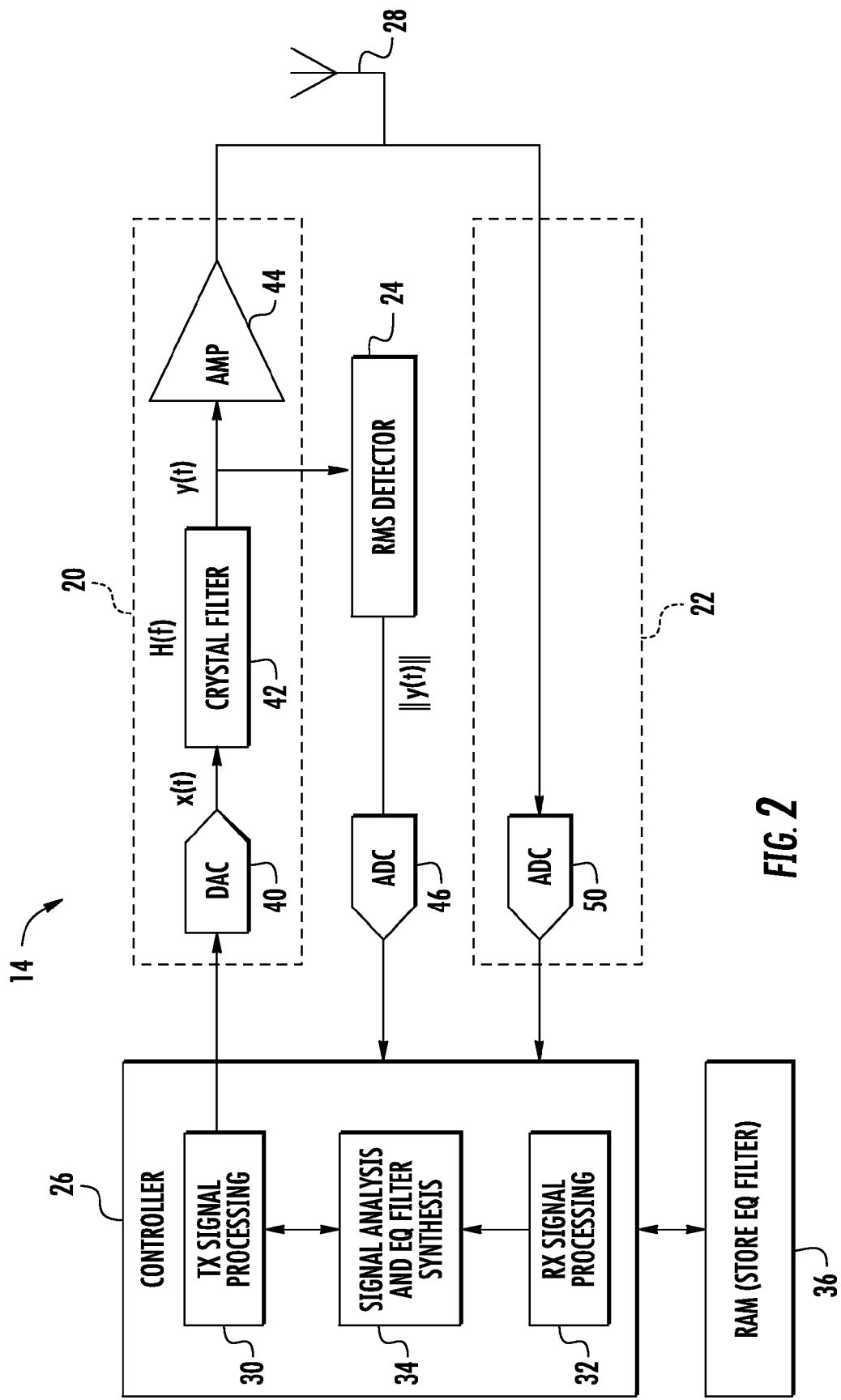
FIG. 2 is a schematic block diagram illustrating the wireless communications device of FIG. 1.

Referring initially to FIGS. 1 and 2, a communication system 10 includes a base station 10 and one or more wireless communication devices 14, 16 that communicate via the base station or directly with each other. The wireless communications device 14 has a transmit signal path 20 including a digital-to-analog converter 40 and associated circuitry such as a crystal filter 42 and amplifier 44. Other linearly distorting elements are also common to a radio transceiver such as a SAW (Surface Acoustic Wave) filter. A receive signal path 22 at least includes an analog-to-digital converter 50. A magnitude detector 24 samples the transmit path 20 and provides an output that is made available to the signal controller 26.

The signal controller 26 is configured to determine amplitude distortion and determine phase distortion based upon information from the magnitude detector 24, and generate an equalization filter through the use of Inverse Fourier Transform techniques or other methods used to move between a magnitude and phase frequency domain representation of a channel and the time impulse response of the inverse of that determined channel, based upon the determined amplitude distortion and phase distortion, e.g. for pre-distortion of regular traffic output through the transmit signal path 20. A memory 36 stores the generated equalization filter.

An associated antenna 28 is downstream from the digital-to-analog converter 40 and associated linear circuitry 42 in the transmit signal path 20. The magnitude detector 24 samples the magnitude of the transmit signal path 20 after the linear circuitry 42. The magnitude detector 24 may be a Root Mean Square (RMS) envelope detector as illustrated in FIG. 2, for example.

The signal controller 26 is configured to determine amplitude distortion from a series of frequency tones (e.g. probes or known signals) on the transmit signal path 20 stepped in frequency across a passband without an EQ filter applied. For example, if the bandwidth of the device 14 is 80 KHz, then the tones may include thirty-two steps across the bandwidth from 40 kHz below the center of the passband to 40 kHz above the center of the passband. The signal controller 26 is configured to determine phase distortion from a phase difference between tones in pairs of tones in a series of pairs with each pair including a first tone at a set frequency and a second tone stepped in frequency across the passband on the transmit signal path 20. The phase difference between first tone and the second tone in each pair is the to-be-determined phase offset due to the linear components between the DAC output and the magnitude detector 24. Pairs of such tones are sent on the transmit path 20 simultaneously.

The present approach produces compensation for both amplitude and phase but only involves the sampling of the output of a magnitude detector, such as an RMS (Root Mean Square) Amplitude Detector with its input driven by known waveforms or tones. Various known wireless communications devices (e.g. tactical radios produced by Harris Corporation Inc. of Rochester Ny and Melbourne Fla.) already include magnitude detection capability to do feedback control of transmit power output.

The present approach extracts amplitude distortion by extracting magnitude information from the magnitude detector 24, based upon a single tone stepped across the passband frequency. The present approach also extracts phase information by transmitting two tones simultaneously and extracting the phase difference between these tones. This is repeated across multiple pairs until the phase difference is found between one tone and each other tone at stepped frequencies across the passband. This may be performed during power-up of the wireless communication device 14 or during other times as may be appropriate.

Equation 1 shows how the squared output of the RMS detector 24 with input of two tones passed through a Linear System H(f), is a DC term plus a term at the difference frequency with phase equal to the difference of the Phase Response of H(f) at tone frequencies.

$$x(t) = A_1 e^{j2\pi f_1 t} + A_2 e^{j2\pi f_2 t}, A_1, A_2 = \text{real positive constants}$$

$$H(f_1) = \|H(f_1)\| e^{j\arg(H(f_1))}, H(f_2) = \|H(f_2)\| e^{j\arg(H(f_2))}$$

$$y(t) = conv(x(t), h(t)) =$$
$$A_1 \|H(f_1)\| e^{j2\pi f_1 t + j\arg(H(f_1))} + A_2 \|H(f_2)\| e^{j2\pi f_2 t + j\arg(H(f_2))}$$

$$\|y(t)\|^2 = y(t) y^*(t) =$$
$$(A_1 \|H(f_1)\| e^{j2\pi f_1 t + j\arg(H(f_1))} + A_2 \|H(f_2)\| e^{j2\pi f_2 t + j\arg(H(f_2))})$$
$$(A_1 \|H(f_1)\| e^{-j2\pi f_1 t - j\arg(H(f_1))} + A_2 \|H(f_2)\| e^{-j2\pi f_2 t - j\arg(H(f_2))}) =$$
$$A_1^2 \|H(f_1)\|^2 + A_2^2 \|H(f_2)\|^2 +$$
$$A_1 A_2 \|H(f_1)\| \|H(f_2)\| e^{j2\pi f_1 t + j\arg(H(f_1))} e^{-j2\pi f_2 t - j\arg(H(f_2))} +$$
$$A_1 A_2 \|H(f_1)\| \|H(f_2)\| e^{-j2\pi f_1 t - j\arg(H(f_1))} e^{j2\pi f_2 t + j\arg(H(f_2))} =$$
$$A_1^2 \|H(f_1)\|^2 + A_2^2 \|H(f_2)\|^2 +$$
$$2 A_1 A_2 \|H(f_1)\| \|H(f_2)\| \cos(2\pi (f_1 - f_2) t + \arg(H(f_1)) - \arg(H(f_2)))$$

Angle difference is extracted by first squaring the output of the magnitude detector 24 (e.g. an RMS detector), then mixing against a local complex exponential with frequency equal to difference frequency of two tones. The mix output is then averaged, leaving a DC term with angle equal to angle difference of response of H(f) at the two frequencies summed with a term due to relative phase of local complex exponential. The technique uses amplitude-only sampling to extract both amplitude and phase information from a linear network to compensate for linear distortions of amplitude ripple and group-delay distortion.

Referring to FIG. 2, an embodiment of a wireless communication device 14 is further described. The transmit path 20 includes a processing (e.g. via a baseband processor 30), which may generate digital inphase (I) and quadrature (Q) data signals. These data signals represent information that has been digitally encoded. The DAC 40 may include an inphase DAC and a quadrature DAC which transform the inphase and quadrature digital signals into inphase and quadrature analog signals, respectively. A single DAC may directly produce an inphase and quadrature modulated signal centered at an I.F. (Intermediate Frequency). For example, the inphase and quadrature digital signals may undergo Quadrature Phase Shift Keying (QPSK), which is a popular modulation format used in digital wireless phones. QPSK uses the simultaneous transmission of two Phase Shift Keying (PSK) signals where one is in quadrature (shifted in phase by) 90° to the other.

The RF signal is sent, via crystal filter 42, to amp 44, e.g. a Power Amplifier (PA), which amplifies the RF signal to a sufficient power level for transmission by antenna 28. The RMS detector 24 provides an output to the signal controller 26, e.g. via ADC 46. The receive signal path 22 may include some common elements with the transmit path 20 (not shown) and provides a digital signal to receive signal processing 32 via ADC 50. A common ADC could also be used.

The approach includes both analysis of linear distortion via sampling of amplitude as well as synthesis of an equalization filter which compensates for the amplitude and phase responses of the device 14. The approach is relevant to any transmitter requiring enhanced Error Vector Magnitude (EVM) performance without being burdened with full duplex circuitry.

As mentioned previously, EVM, is due to both linear and non-linear distortion in the transmit path components that are between the transmit processing 30 and antenna 28, and mismatches in amplitude and/or phase difference between the inphase and quadrature signal paths. These problems cause the vector magnitude and phase representations of the inphase and quadrature data to be incorrect. The resulting error in the magnitude and/or phase can cause distortion in the transitions from state to state at the device output which in turn produce errors in the receiver.

Figure 3:
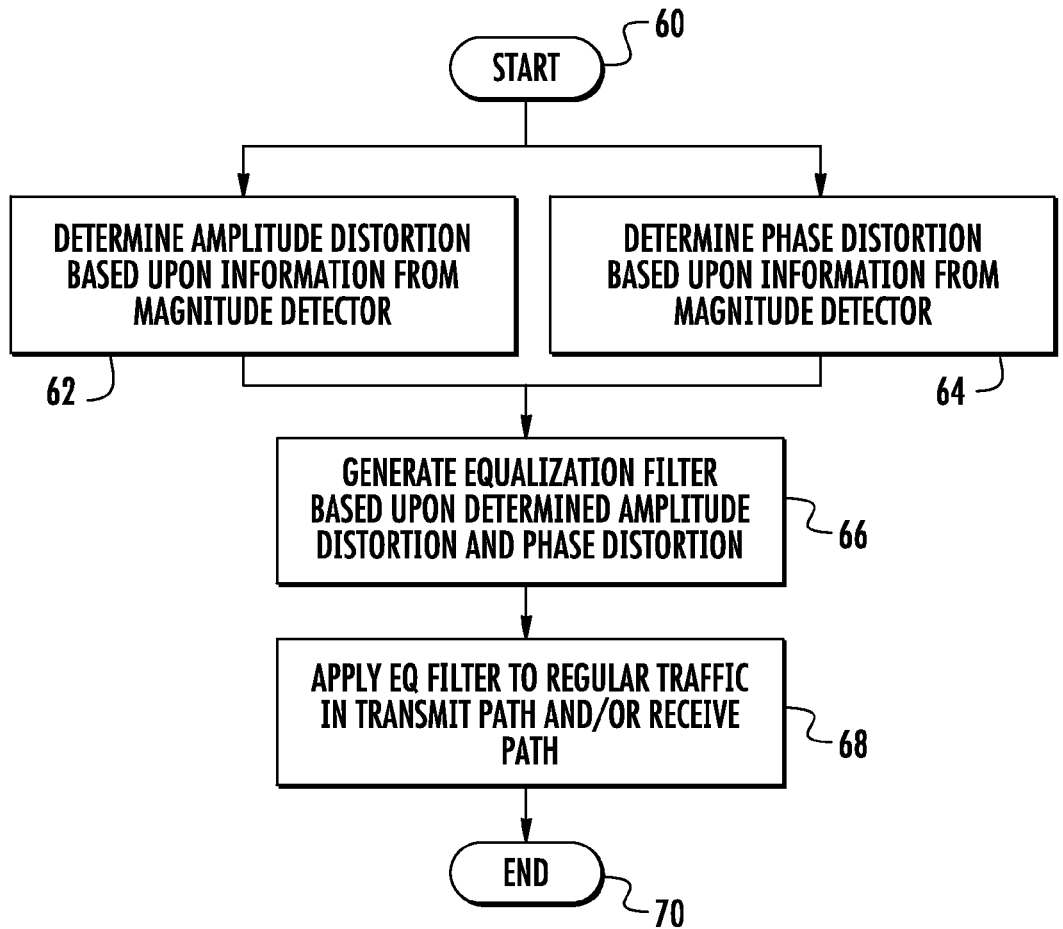
FIG. 3 is a flowchart illustrating steps of a method of compensating for linear distortions in at least a transmit signal path of the wireless communications device of FIG. 1.

A method aspect (with additional reference to FIG. 3) is directed to compensation for linear distortions in at least a transmit signal path 20 of a wireless communications device 14. The compensation is also applicable to a receive path if the transmit and receive paths are designed to have a common linearly-distorting component or set of components.

The method begins (block 60) and includes determining amplitude distortion (block 62) and also determining phase distortion (block 64) based upon information from a magnitude detector 24 sampling the transmit signal path 20 and providing magnitude estimate to a signal controller in the wireless communication device 14. The method further includes generating an equalization filter (block 66), derived from the magnitude samples and subsequently computed magnitude and phase distortion that can be used, for example, in both transmit and receive to reduce distortion due to linearly distorting elements common to the receive and transmit paths (block 68) before ending at block 70. If sampling rates differ between the transmit and receive paths then different EQ filters will be needed for respective transmit and receive paths.

As discussed above, determining amplitude distortion is based upon a series of tones, on the transmit signal path 20, stepped in frequency across a passband. Determining phase distortion is based upon a phase difference between tones in pairs of tones in a series of pairs with each pair including a first tone at a set frequency and a second tone stepped in frequency across the passband, on the transmit signal path 20. The first tone and the second tone in each pair includes a known phase relationship and an unknown relationship due to linearly-distorting elements in the transmit path Thus, in the present approach, a transmit signal can be sampled without a relatively expensive Vector Signal Analyzer or burdensome circuitry that allows for Full Duplex Sampling of I/Q components of the transmitted signal.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A wireless communications device comprising:
  a transmit signal path including a digital-to-analog converter and a power amplifier downstream from said digital-to-analog converter;
  a receive signal path including an analog-to-digital converter;
  the transmit signal path and the receive signal path comprising common linearly-distorting elements;
  a magnitude detector configured to sample the transmit signal path before said power amplifier and independently from the receive signal path; and
  a signal controller configured to determine amplitude distortion and determine phase distortion based upon information from the magnitude detector, and generate an equalization filter, based upon the determined amplitude distortion and phase distortion for pre-distortion of traffic output through the transmit signal path, and for compensating for distortion on the receive signal path.

2. The wireless communications device of claim 1, wherein the transmit signal path further comprises linearly-distorting elements downstream from the digital-to-analog converter; and wherein the magnitude detector is configured to sample the transmit signal path after the linearly-distorting elements.

3. The wireless communications device of claim 1, wherein the signal controller is configured to generate the equalization filter for pre-distortion of traffic output through the transmit signal path.

4. The wireless communications device of claim 1, wherein the signal controller is configured to determine amplitude distortion from a series of tones on the transmit signal path stepped in frequency across a passband.

5. The wireless communications device of claim 1, wherein the signal controller is configured to determine phase distortion from a phase difference between tones in pairs of tones in a series of pairs with each pair including a first tone at a set frequency and a second tone stepped in frequency across the passband on the transmit signal path.

6. The wireless communications device of claim 5, wherein the first tone and the second tone in each pair includes a known phase relationship.

7. The wireless communications device of claim 1, the magnitude detector comprises a Root Mean Square (RMS) envelope detector.

8. The wireless communications device of claim 1, further comprising a memory configured to store the generated equalization filter.

9. A wireless communications device comprising:
  a transmit signal path including a digital-to-analog converter and a power amplifier downstream from said digital-to-analog converter;
  a receive signal path including an analog-to-digital converter;
  the transmit signal path and the receive signal path comprising common linearly-distorting elements;
  a magnitude detector configured to sample the transmit signal path before said power amplifier and independently from the receive signal path; and a signal controller configured to compensate for linear distortions in at least the transmit signal path, based upon information from the magnitude detector, said signal controller configured to
- determine amplitude distortion from a series of tones on the transmit signal path stepped in frequency across a passband,
- determine phase distortion from a phase difference between tones in pairs of tones in a series of pairs with each pair including a first tone at a set frequency and a second tone stepped in frequency across the passband on the transmit signal path, and
- generate an equalization filter, based upon the determined amplitude distortion and phase distortion, for pre-distortion of regular traffic output through the transmit signal path and for compensating for distortion on the receive signal path.

10. The wireless communications device of claim 9, wherein the transmit signal path further comprises linearly-distorting elements downstream from the digital-to-analog converter; and wherein the magnitude detector is configured to sample the transmit signal path after the linearly-distorting elements.

11. The wireless communications device of claim 9, wherein the magnitude detector comprises a Root Mean Square (RMS) envelope detector.

12. The wireless communications device of claim 9, wherein the first tone and the second tone in each pair includes a known phase relationship.

13. The wireless communications device of claim 9, further comprising a memory configured to store the generated equalization filter.

14. A method to compensate for linear distortions in a transmit signal path of a wireless communications device, the transmit signal path comprising a digital-to-analog converter and a power amplifier coupled downstream from the digital-to-analog converter, the method comprising:
- determining amplitude distortion and phase distortion based upon information from a magnitude detector sampling the transmit signal path before the power amplifier and independently from a receive signal path in the wireless communication device, the transmit signal path and the receive signal path comprising common linearly-distorting elements; and
- generating an equalization filter, based upon the determined amplitude distortion and phase distortion for compensating for distortion on the receive signal path.

15. The method of claim 14, wherein the transmit signal path further comprises linearly distorting elements downstream from the digital-to-analog converter and; and wherein the magnitude detector samples the transmit signal path after the linearly-distorting elements.

16. The method of claim 15, further comprising storing the generated equalization filter in a memory.

17. The method of claim 14, further comprising pre-distorting regular traffic output through the transmit signal path with the equalization filter.

18. The method of claim 14, wherein the magnitude detector comprises a Root Mean Square (RMS) envelope detector.

19. The method of claim 14, wherein determining amplitude distortion is based upon a series of tones, on the transmit signal path, stepped in frequency across a passband.

20. The method of claim 14, wherein determining phase distortion is based upon a phase difference between tones in pairs of tones in a series of pairs with each pair including a first tone at a set frequency and a second tone stepped in frequency across the passband, on the transmit signal path.

21. The method of claim 20, wherein the first tone and the second tone in each pair includes a known phase relationship.

22. The method of claim 14, wherein the equalization filter is generated during power-up of the wireless communication device.

* * * * *